United States Patent [19]

Malleo-Roach et al.

[11] Patent Number: 5,187,712
[45] Date of Patent: Feb. 16, 1993

[54] PSEUDO-EXHAUSTIVE SELF-TEST TECHNIQUE

[75] Inventors: John A. Malleo-Roach, Lambertville; Paul W. Rutkowski, Morris Plains; Eleanor Wu, Princeton, all of N.J.

[73] Assignee: AT&T Bell Laboratories, Murray Hill, N.J.

[21] Appl. No.: 484,336

[22] Filed: Feb. 26, 1990

[51] Int. Cl.$^5$ .......................................... G01R 31/28
[52] U.S. Cl. ................... 371/22.1; 371/22.5; 371/27
[58] Field of Search ................ 371/22.1, 22.3, 22.4, 371/22.5, 27

[56] References Cited

PUBLICATIONS

Roberts, M. et al., "An Algorithm for the Partitioning of Logic Circuits", IEE Proc., vol. 131, Pt.E, No. 4, Jul. 1984, pp. 113-118.
E. J. McCluskey and S. Bozorgui-Nesbat, "Design for Autonomous Test", IEEE Transactions on Computers, vol. C-30, No. 11, Nov. 1981, pp. 866-875.
S. B. Akers, "On the Use of Linear Sums in Exhaustive Testing", Proceedings, Fault Tolerant Computing Conference, pp. 148-163 (IEEE), 1985.
E. Wu, "Towards an Optimal Pseudo-Exhaustive Test Generation Algorithm", Conference Proceedings, Built-In Self-Test Workshop. IEEE Test Technology Committee, Mar. 23-25, 1988.
IEE Publication, "Review of Built-In Test Methodologies and Gate Arrays", by K. A. E. Totton, IEE Proceedings I. Solid-State and Electron Devices, vol. 132, Parts E and I, No. 2, Mar./Apr. 1985, pp. 121-129, Stevenage, Great Britain.
IEEE Publication "PEST, a Tool for Implementing Pseudo-Exhaustive Self-Test", by E. Wu, Proceedings of the IEEE 1990 Custom Integrated Circuits Conference, Boston, Mass., May 13-16, 1990, pp. 28.4.1-28.4.3.
IEEE Publication "Automated BIST for Sequential Logic Synthesis", by C. E. Stroud IEEE Design & Test of Computers, vol. 5, No. 6+index, Dec. 1988, pp. 22-23 New York, N.Y.
EPO Patent Application Publication No. 0164209, Published Dec. 11, 1985. IEE Publication "Use of Linearisation and Spectral Techniques in Input and Output Compaction Testing of Digital Networks", by S. L. Hurst, IEE Proceedings E. Computers and Digital Techniques, vol. 136, Part E, No. 1, Jan. 1989, pp. 48-56, Stevenage, Herts., Great Britain.
IBM Technical Disclosure Bulletin, "PRPG/MISR Circuit", pp. 11-13, IBM vol. 32, No. 2, Jul. 1989.
Wang, L. et al., "Circuits for Pseudoexhaustive Test Pattern Generation", IEEE Trans. on Computer-Aided Design, vol. 7, No. 10, Oct. 1988, pp. 1068-1080.
Saluja, K. et al., "A Concurrent Testing Technique for Digital Circuits", IEEE Trans. on Computer-Aided Design, vol. 7, No. 12, Dec. 1988, pp. 1250-1259.
Wang, L. et al., "A Self-Test and Self-Diagnosis Architecture for Boards Using Boundary Scans", Proc. 1st Eur. Test Conf., Paris, Apr. 12-14, 1989, pp. 119-126.
Gloster, C. et al., "Boundary Scan with Built-In Self-Test", IEEE Design & Test of Computers, Feb. 1989, pp. 36-44.

Primary Examiner—Stephen M. Baker
Attorney, Agent, or Firm—Robert B. Levy

[57] ABSTRACT

Psuedo-exhaustive self-testing of an electronic circuit (10), containing groups of combinational elements ($14_1$, $14_2$, $14_3$ ... $14_n$), is accomplished by first partitioning the groups of combinational elements into sub-cones having no more than w imputs each by designating appropriate nodes ("test points") in each cone as the output of a sub-cone. A set of test vectors $\{a_1, a_2 \ldots a_w, b_1, b_2 \ldots b_w\}$ is then generated (via an internal generator 74) such that when the vectors are applied to the sub-cones ($14_{1a}$, $14_{1b}$ ... $14_{ij}$), each sub-cone will be exhaustively tested. Each of the inputs of the sub-cones is assigned to receive a vector such that the vectors received at the inputs are linearly independent. The subset of vectors is applied through each of a plurality of pseudo-exhaustive self-test (PEST) flip-flop circuits (88) and through the test points to test the circuit. The PEST flip-flop circuits 88 also serve to advantageously compact and observe the response data produced by each sub-cone ($14_{ij}$) with that of an upstream sub-cone.

5 Claims, 8 Drawing Sheets

PSEUDO-EXHAUSTIVE SELF-TEST TECHNIQUE

TECHNICAL FIELD

This invention relates generally to a technique for accomplishing self-testing of a sequential digital integrated circuit to find the faults (if any) therein.

BACKGROUND OF THE INVENTION

Digital integrated circuits are conventionally tested by successively applying test vectors to the inputs of the circuit. Upon receipt of each test vector, which takes the form of a pattern of ones and/or zeros, the circuit responds by producing a response at its outputs, each response also being comprised of a pattern of ones and/or zeros. When the circuit is operating properly, the response at each output of the circuit will match an expected response for each input test vector. If a fault exists, then a mismatch occurs. The higher the percentage of possible faults that can be detected, the greater the confidence of the lack of any faults in the circuit. Achieving 100% fault coverage is very difficult without exhaustive testing. In the past, testing of a circuit has been accomplished by first mathematically modeling the circuit and all its possible faults. Using the mathematical model, a set of test vectors is then generated, which, when successively applied to the circuit, may reveal most of the possible faults. While algorithms for fault simulation and test vector generation exist, applying such algorithms to a circuit of even moderate complexity is a time-consuming task, often requiring weeks or months of effort. As a practical matter, obtaining 100% fault coverage, while desirable, has previously proven impractical.

Thus, there is a need for a technique for achieving 100% fault coverage of a sequential digital integrated circuit without the need for fault simulation or deterministic test generation.

SUMMARY OF THE INVENTION

Briefly, in accordance with the invention, a method is disclosed for pseudo-exhaustively testing a sequential digital circuit comprised of both combinational elements (i.e., AND, NAND, NOT, OR or NOR gates) and sequential elements (i.e., flip-flops). The method is initiated by partitioning the combinational elements into "cones" (i.e., groups of elements), each cone having a single output and no more than a predetermined number of inputs. The limited number of inputs to each cone allows it to be easily exhaustively tested as described hereinafter. Following partitioning, a finite set of test vectors, referred to as "canonical vectors," is generated by combining a binary vector-counting sequence with a prescribed logical variation of the counting sequence. This set of the canonical vectors is assigned to the inputs of each cone such that the vectors assigned to each cone are linearly independent of each other. In this way, all of the cones can be tested simultaneously while, at the same time, each cone is exhaustively tested. As each assigned canonical vector of the set is applied to the inputs of its associated cone, a response is produced at the output of the cone. The responses are successively compacted to yield a reduced length stream of bits representative of the response of the combinational elements to the canonical vectors. The sequential elements are themselves tested by linking them in daisy-chain fashion and then employing well-known scan testing techniques.

The above-described technique is referred to as "pseudo-exhaustive" because the canonical vectors assigned to each logic cone serve to exhaustively test the cones. By applying the canonical vectors to the cones in parallel, all of the cones can be tested. In this way, the combinational elements can be exhaustively tested in a rapid fashion.

In accordance with another aspect of the invention, the above-described technique can be implemented within a sequential digital integrated circuit to render the circuit "self-testing." In this regard, the circuit must be modified to include a vector generator for generating the canonical vectors. Further, each flip-flop in the circuit is modified to be a "Pseudo-Exhaustive Self-Test" (PEST) flip-flop which serves to advantageously compact the responses from the logic cones as well as to provide a link with each of the other PEST flip-flops, allowing them to be daisy-chained together for scan testing.

DETAILED DESCRIPTION

Introduction (Circuit Model)

Figure 1:
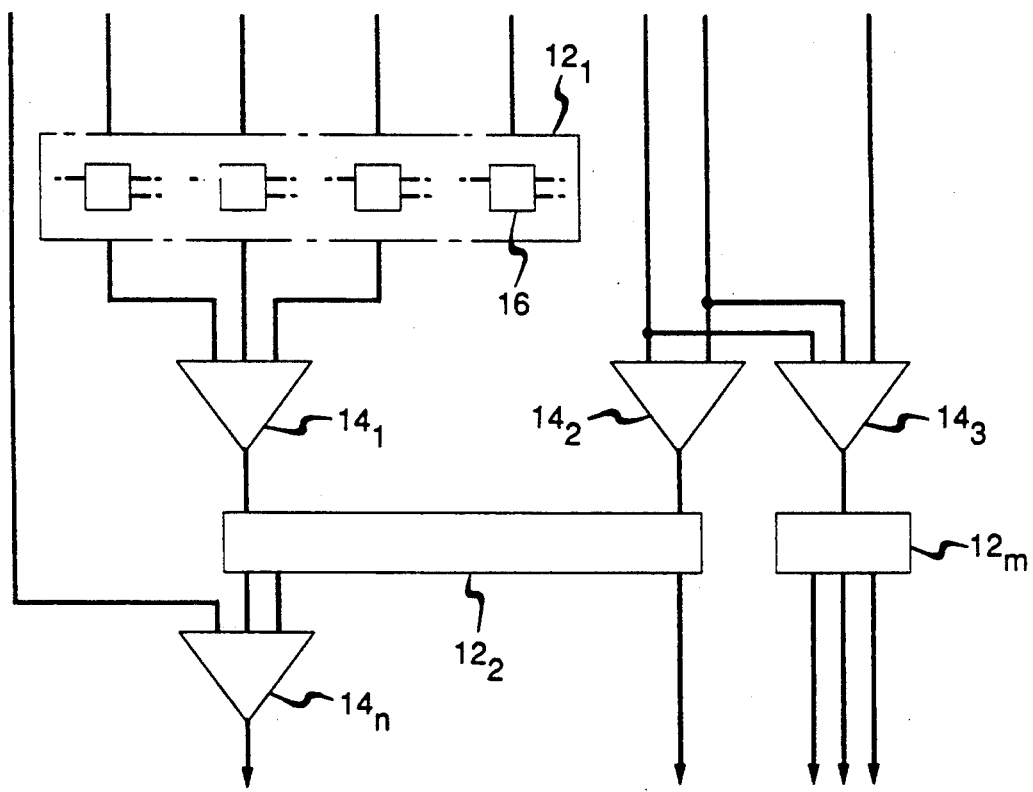
FIG. 1 is a block diagram of a conventional prior art circuit which is to be pseudo-exhaustively self-tested in accordance with the technique of the present invention.
Figure 2:
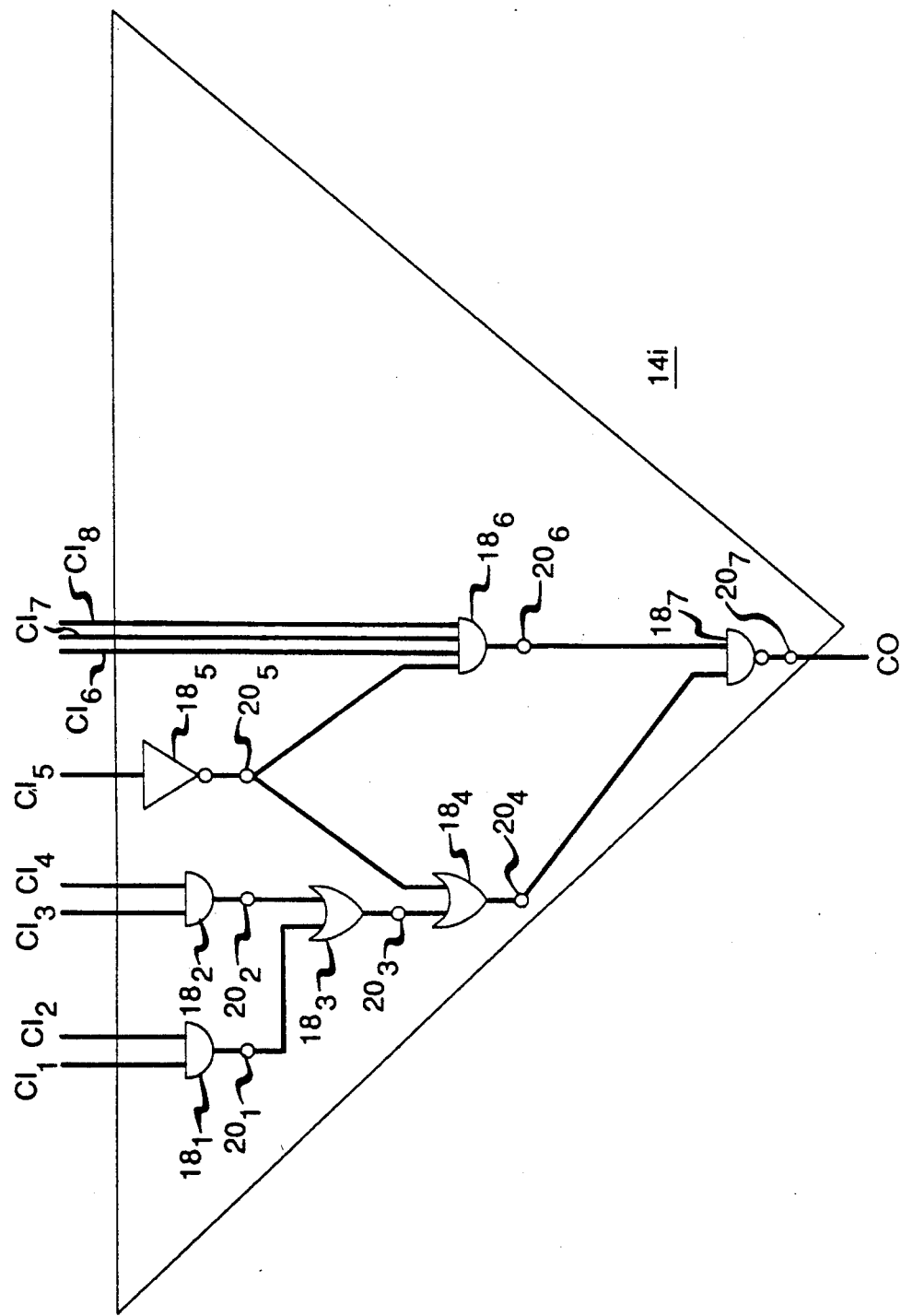
FIG. 2 is a block schematic diagram of a logic cone comprising a portion of the prior art circuit of FIG. 1.

FIG. 1 shows a model of a conventional sequential digital electronic circuit 10 which is to be tested. When modeled in the manner shown in FIG. 1, the circuit 10 takes the form of a plurality of registers $12_1, 12_2, 12_3 \ldots 12_m$ and a plurality of logic cones $14_1, 14_2, 14_3 \ldots 14_n$ where m and n are integers. Each register $12_i$ represents a set of one or more sequential elements 16, each element comprised of a flip-flop. As seen in FIG. 2, each logic cone $14_i$ represents a group of combinational elements $18_1, 18_2, 18_3 \ldots 18_k$ (where k is an integer) which are coupled together such that each logic cone may have as few as one or as many as p inputs $CI_1, CI_2, CI_3 \ldots CI_p$ (where p is an integer) and a single output CO.

Each of the logic elements $18_i$ may take the form of an AND, OR, NAND, NOR or NOT logic gate.

The particular cone $14_i$ shown in FIG. 2 is comprised of seven logic gates $18_1, 18_2, 18_3, 18_4, 18_5, 18_6$ and $18_7$. The logic gates $18_1$ and $18_2$ are each two-input AND gates whose inputs are coupled to a separate one of the cone inputs $CI_1$–$CI_4$. The outputs of the gates $18_1$ and $18_2$ (designated by nodes $20_1$ and $20_2$, respectively) are inputs of the logic gate $18_3$ which is a two-input OR gate. The logic gate $18_3$ has its output (node $20_3$) coupled to one of the inputs of the logic gate $18_4$ which is also a two-input OR gate. The logic gate $18_5$ is a single-input NOT gate whose input is the cone input $CI_5$ and whose output (node $20_5$) is the second input of the logic element $18_4$. The output of the logic gate $18_5$ is also coupled to one of the inputs of the logic gate $18_6$ which is a four-input AND gate. Each of the remaining inputs of the logic gate $18_6$ is coupled to a separate one of the cone inputs $CI_6$–$CI_8$, respectively. The logic gates $18_6$ and $18_4$ have their outputs (nodes $20_6$ and $20_4$) coupled to a separate one of the inputs of a two-input logic element $18_7$ (a two-input NAND gate) having an output $20_7$ which serves as the cone output CO.

The cone $14_i$ depicted in FIG. 2 is merely exemplary and the other cones $14_1$–$14_n$ may be structured differently, depending on the configuration of the circuit 10 whose combinational elements are to be modeled by the cones. It is important to remember that while each of the cones $14_1$–$14_n$ may have as many as p inputs $CI_1$–$CI_p$, each cone has but one output CO. Thus, if the circuit 10 were comprised of a plurality of combinational elements 18 coupled so as to have x inputs and y outputs, the combinational elements in the circuit could be modeled by y cones $14_1$–$14_y$, each having as many as x inputs.

Partitioning (Overview)

Complete testing of the circuit 10 of FIG. 1 requires that both the registers $12_1, 12_2, 12_3 \ldots 12_m$ and the logic cones $14_1, 14_2, 14_3 \ldots 14_n$ be tested. The registers $12_1, 12_2, 12_3 \ldots 12_m$ can be self-tested by appropriately sequencing their input signals in a manner described hereinafter. The logic cones $14_1, 14_2, 14_3 \ldots 14_n$ are tested by applying successive test vectors to their inputs then analyzing the response signals at their outputs.

If the largest of the logic cones $14_1, 14_2 \ldots 14_n$ in the circuit 10 has w inputs (where w is an integer), then the absolute lower bound on the number of test vectors required to exhaustively test all of the cones simultaneously is $2^w$. Most present day schemes either require more than $2^w$ test vectors to accomplish such exhaustive testing or have difficulty in testing all of the cones simultaneously and have to resort to test scheduling, thus lengthening the testing process.

To overcome these difficulties, we have invented a pseudo-exhaustive testing technique. The first step in pseudo-exhaustively testing the circuit 10 is to establish the maximum size of w, the largest number of inputs to any of the cones $14_1, 14_2, 14_3 \ldots 14_n$. Thus far, the maximum input size of the largest of the cones $14_1, 14_2, 14_3 \ldots 14_n$ has not been treated as a variable, but rather as a constant arising from the modeling of the combinational elements of the circuit 10 so as to be represented by the cones themselves. However, in accordance with the invention, it is possible to reduce the number of cone inputs w by partitioning the cones $14_1$–$14_n$ into smaller "sub-cones." By reducing the value of w, the length of the test vectors required to accomplish exhaustive testing can be minimized, reducing the time required to accomplish testing.

Figure 3:
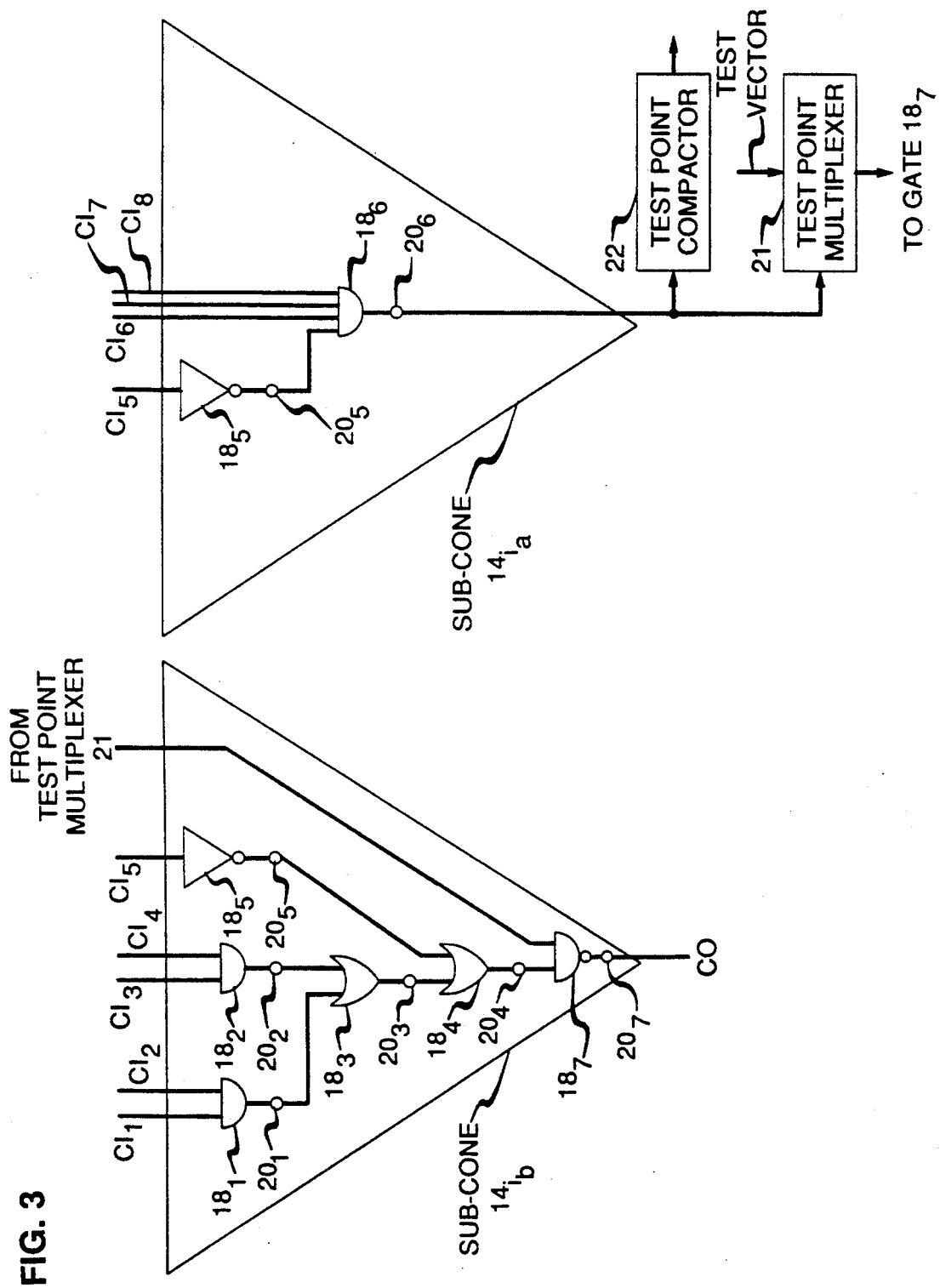
FIG. 3 is a block schematic diagram of each of a pair of sub-cones obtained by partitioning the cone of FIG. 2.

Referring to FIG. 3, the logic cone $14_i$ which has eight inputs (w = 8) may be partitioned into a first sub-cone $14_{ib}$ having six inputs and a second sub-cone $14_{ia}$ which has four inputs. Partitioning each logic cone $14_i$ into two or more sub-ones $14_{ia}, 14_{ib} \ldots$ is simply a matter of designating which of the nodes $20_1, 20_2, 20_3 \ldots$ will serve as a "test point," that is, the output of a sub-cone. Referring to FIG. 3, designating the node $20_6$ as a test point (TP) establishes a sub-cone $14_{ia}$ comprised of the gates $18_5$ and $18_6$. The sub-cone $14_{ia}$ has, as its inputs, the cone inputs $CI_5$–$CI_8$ and has the node $20_6$ as its output.

Designating the node $20_6$ as a test point also establishes a second sub-cone $14_{ib}$ which is comprised of the gates $18_1$–$18_5$ and $18_7$. (Note that the gate $18_5$ is shared by both of the sub-cones $14_{ia}$ and $14_{ib}$). The sub-cone $14_{ib}$ has, among its inputs, the cone inputs $CI_1$–$CI_5$. In addition, the sub-cone $14_{ib}$ also has an additional input, i.e., the input at the gate $18_7$, which, under normal operation of the circuit 10 of FIG. 1, receives the output of the gate $18_6$, now part of the sub-cone $14_{ia}$.

Figure 7:
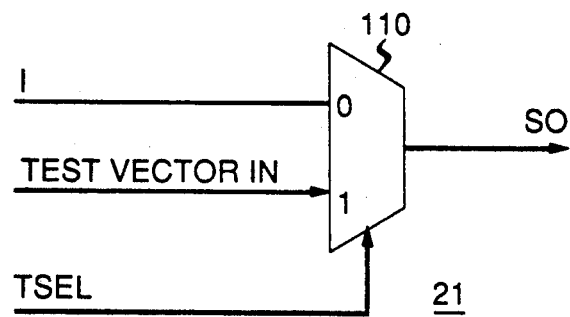
FIG. 7 is a block diagram of a test point multiplexer for incorporation within the circuit of FIG. 3 to apply the vectors generated by the generator of FIG. 6.

During testing of the sub-cone $14_{ib}$, it is undesirable for the gate $18_6$ to feed the gate $18_7$ when the former lies within a different sub-cone from the latter because each sub-cone should be supplied with an exhaustive set of test vectors. To allow for parallel testing, a test point multiplexer 21, described in greater detail with respect to FIG. 7, is associated with the sub-cone $14_{ia}$ and serves to connect the node $20_6$ to the gate $18_7$ of the sub-cone $14_{ib}$. During normal operation of the circuit 10 of FIG. 1, the test point multiplexer 21 passes the signal at the node $20_6$ to the gate $18_7$ as would normally occur absent the multiplexer 21. However, during testing, the test point multiplexer 21 injects a test vector into the gate $18_7$ so that the sub-cone $14_{ib}$ can be tested exhaustively. Also associated with the sub-cone $14_{ia}$ is a test point compactor 22 which, as will be described in greater detail in FIG. 9, serves to compact the test response of the sub-cone $14_{ia}$.

It may seem that partitioning the cones $14_1$–$14_n$ into a set of sub-cones $14_{1a}, 14_{1b} \ldots, 14_{2a}, 14_{2b} \ldots, 14_{na} 14_{nb} \ldots 14_{nx}$ (where x is an integer) is antithetical to the goal of accomplishing rapid, exhaustive testing of the combinational elements $18_1$–$18_k$ in each cone. However, when the cones $14_1$–$14_n$ are partitioned into the sub-cones $14_{1a}$–$14_{nx}$, each resultant sub-cone, which has a reduced number of inputs, can be exhaustively tested with a smaller number of vectors. While the number of sub-cones created by partitioning always exceeds the original number of cones $14_1$–$14_n$, the sub-cones can be tested in parallel. By testing each sub-cone with a reduced number of test vectors in parallel with the other sub-cones, the actual testing time may be reduced.

Partitioning Procedure

Figure 4:
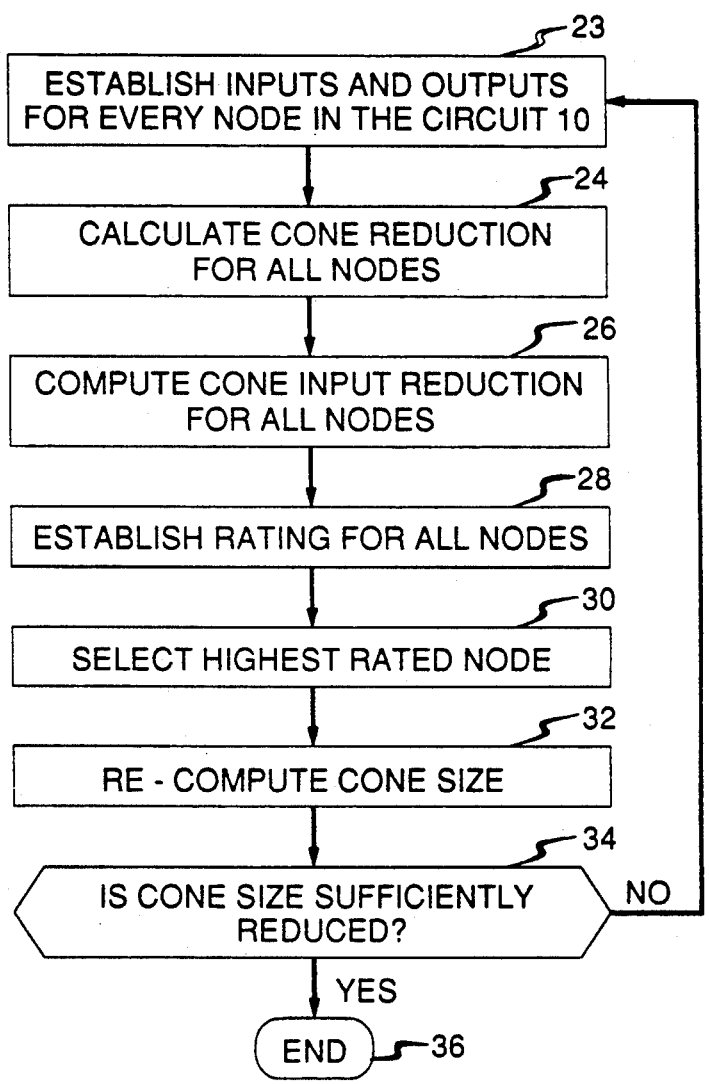
FIG. 4 is a flowchart description of a process by which the logic cone of FIG. 2 is partitioned.

In accordance with the present invention, the first step in the process of pseudo-exhaustively testing the logic cones $14_1, 14_2 \ldots 14_n$ is to partition them into a set of sub-cones $14_{1a}$–$14_{nx}$ in the manner just described. Referring to FIG. 4, there is shown a flowchart diagram of a method employed to partition each of the cones $14_1, 14_2 \ldots 14_n$ into a set of sub-cones $14_{1a}$–$14_{nx}$ by designating which of the nodes in each cone is to serve as a test point TP (i.e., the output of a sub-cone). The first step (step 23) in the partitioning process is to examine each node $20_i$ (i being initially set to 1) in each of the cones $14_1$-$14_n$ to determine the node's primary inputs and its primary outputs. For example, in FIG. 2, the node $20_6$ is fed by the input $CI_5$-$CI_8$ and has the cone output CO as its output. In practice, two or more of the cones $14_1,14_2 \ldots 14_n$ may have their inputs overlapping so that a given one of the nodes $20_1 \ldots 20_n$ may feed more than one output.

Following step 23, step 24 is executed and, for each node $20_i$ in each of the cones $14_1$-$14_n$, a calculation is made to determine how many, if any, of the cones will be reduced to the desired input size (w) if the particular node is designated as a test point (TP). The result of the calculation yields a rating for each node which represents the desirability of assigning the node as a test point. The greater the number of cones $14_1$-$14_n$ which will be reduced in size, the higher the rating. The rating is made more accurate by executing step 26. During step 26 a calculation is made for each node $20_i$ in those cones not reduced to the proper size to determine the reduction of the number of inputs if the node were designated as a test point. Step 28 is executed following step 26, and a final rating is established for each of the nodes $20_1$-$20_n$ based on the calculations made during the previous steps.

Following step 28, step 30 is executed and the node rated highest is designated as a test point, thereby partitioning the cone containing the node into two or more sub-cones $14_{ia},14_{ib} \ldots$ as previously described with respect to FIG. 3. More than one of the cones $14_i$-$14_n$ may be partitioned by the designation of a particular node $20_i$ as a test point TP. After step 30, then step 32 is executed and the cone size, that is, the maximum number of inputs of each sub-cone $14_{ij}$ and the remaining cones, is recomputed. Next, step 34 is executed and a check is made to determine whether each sub-cone $14_{ij}$ has no more than the desired number of inputs (w). If so, step 36 is executed and the partitioning of the cones $14_1,14_2 \ldots 14_n$ is ended. Otherwise, program execution branches back to step 23 and those following it.

Note that, depending on the structure of each of the individual cones $14_1,14_2 \ldots 14_n$, there may indeed be one or more cones which already have less than w inputs. Thus no partitioning of them is necessary. For ease of discussion, when we refer below to each sub-cone $14_{ij}$, each remaining one of the cones $14_1,14_2 \ldots 14_n$ which has less than w inputs is included in the definition of a sub-cone.

Vector Assignment (Overview)

Following partitioning of the circuit 10 of FIG. 1, the next step in our testing method is to generate a set of test vectors which, when applied to each sub-cone $14_{ij}$, will exhaustively test it. A binary counting sequence of w column vectors, each of a length $2^w$, will exhaustively test an individual one of the sub-cones $14_{ij}$. (However, for reasons which will be explained later, testing of all the sub-cones in parallel with a set of $2^w$ vectors may not always be possible.) Assuming, for simplicity purposes, that the maximum cone size w is 3, the starting point for generating the set of exhaustive test vectors is to establish a binary counting sequence from 0 to 7 and to establish a set of of column vectors, $a_1, a_2,$ and $a_3$, accordingly, each $2^w$ (8) bits long.

TABLE I

| $a_1$ | $a_2$ | $a_3$ |
|---|---|---|
| 0 | 0 | 0 |
| 0 | 0 | 1 |

TABLE I-continued

| $a_1$ | $a_2$ | $a_3$ |
|---|---|---|
| 0 | 1 | 0 |
| 0 | 1 | 1 |
| 1 | 0 | 0 |
| 1 | 0 | 1 |
| 1 | 1 | 0 |
| 1 | 1 | 1 |

The counting sequence of vectors $\{a_1, a_2 \ldots a_w\}$ shown in Table I, is sufficient to exhaustively test a sub-cone $14_{ij}$ of size w=3 independently.

However, as indicated previously, overlapping of the inputs of the sub-cones $14_{ia}$-$14_{nx}$ is common. Because of such overlapping, assigning separate vectors of the set $\{a_1, a_2, a_3 \ldots a_w\}$ to each input of each sub-cone $14_{ij}$ (or alternatively, assigning the input to a vector) so that no sub-cone has two or more of its inputs supplied with the same vector is usually impossible. Thus, to exhaustively test all of the sub-cones in parallel, the vector set $\{a_1, a_2, a_3 \ldots a_w\}$ must be augmented with an additional set of vectors $\{b_1, b_2, b_3 \ldots b_w\}$.

Each vector $b_i$ can be generated by taking the linear sum (modulo 2) of all but the $i^{th}$ one of the vectors $a_1, a_2 \ldots a_w$ in accordance with the relationship:

$$b_i = [\oplus_{i=1,w} a_i] \oplus a_i$$

In the given example where w=3, $b_1, b_2$ and $b_3$ can be given as follows

TABLE II

| $b_1 =$ | $a_2 \oplus$ | $a_3$ | $b_2 =$ | $a_1 \oplus$ | $a_3$ | $b_3 =$ | $a_1 \oplus$ | $a_2$ |
|---|---|---|---|---|---|---|---|---|
| 0 | 0 | 0 | 0 | 0 | 0 | 0 | 0 | 0 |
| 1 | 0 | 1 | 1 | 0 | 1 | 0 | 0 | 0 |
| 1 | 1 | 0 | 0 | 0 | 0 | 1 | 0 | 1 |
| 0 | 1 | 1 | 1 | 0 | 1 | 1 | 0 | 1 |
| 0 | 0 | 0 | 1 | 1 | 0 | 1 | 1 | 0 |
| 1 | 0 | 1 | 0 | 1 | 1 | 1 | 1 | 0 |
| 1 | 1 | 0 | 1 | 1 | 0 | 0 | 1 | 1 |
| 0 | 1 | 1 | 0 | 1 | 1 | 0 | 1 | 1 |

The combined set of vectors $\{a_1, a_2 \ldots a_w, b_1, b_2 \ldots b_w\}$ yields a plurality of subsets, each with no more than w elements, which can accomplish exhaustive testing of each sub-cone $14_{ij}$ if the elements of the subset are linearly independent. A subset is linearly independent if any of the following conditions are satisfied:

(1) the set has a single i pair of elements (e.g., it contains only one of the vector column pairs $a_i b_i$); or (2) the subset has w elements and contains no i pairs (i.e., none of the column vector pairs $a_1 b_1, a_2 b_2 \ldots a_w b_w$) and the number of $b_i$'s is even; or (3) the subset of test vectors has less than w elements and no i pairs.

For purposes of explanation, the above rules are predicated on obtaining the vectors $a_1, a_2 \ldots a_w$, from the binary counting sequence. In practice, any exhaustive set may be substituted in place of the set $a_1, a_2, a_3 \ldots a_w$.

Vector Assignment

Figure 5:
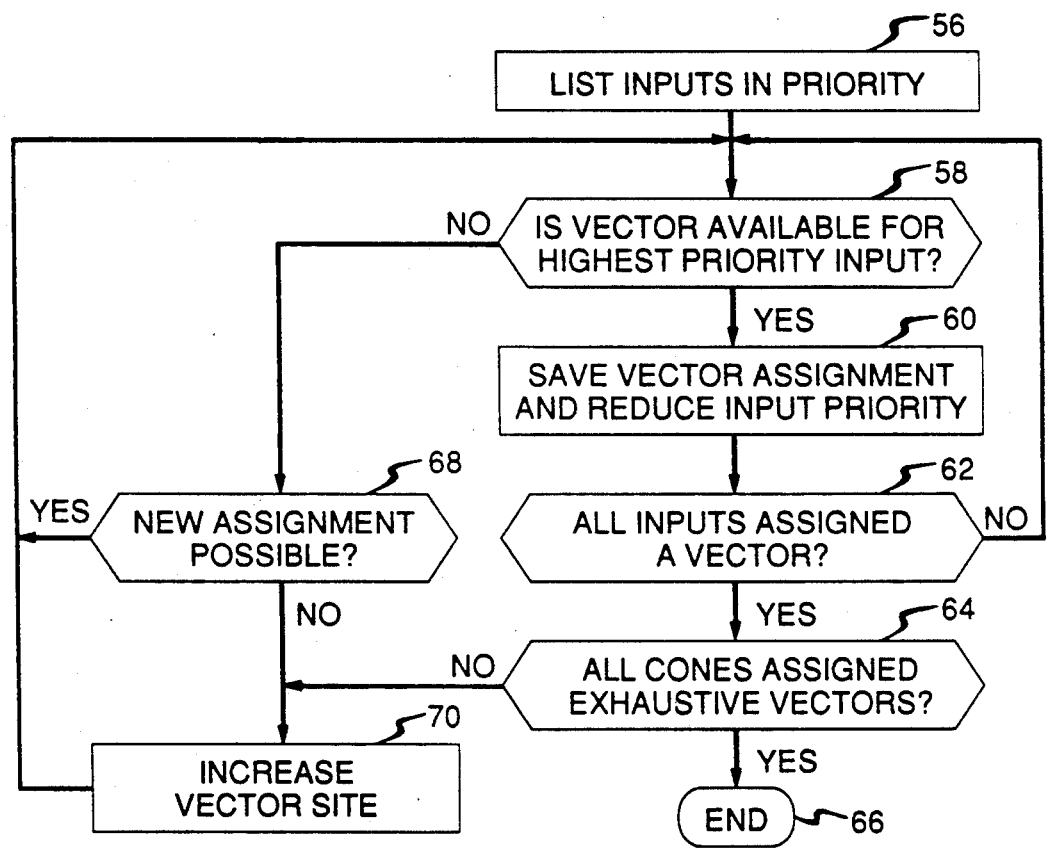
FIG. 5 is a flowchart representation of a process for assigning test vectors to the partitioned cone of FIG. 2.

In practice, assignment of selected ones of the vectors $\{a_1, a_2 \ldots a_w, b_1, b_2 \ldots b_w\}$ to the inputs of the sub-cones $14_{1a}$-$14_{nx}$ is carried out by the process shown in flowchart form in FIG. 5. Referring to FIG. 5, the first step (step 56) in the process is to prioritize the inputs of each of the sub-cones $14_{1a}$-$14_{nx}$. There are several ways in which priority can be assigned. For instance, the inputs can be randomly ordered. However, prioritizing the inputs by assigning the highest priority to those in the largest one of the sub-cones $14_{1a}$–$14_{nx}$ has been found to yield better results. Within each sub-cone $14_{ij}$, priority may be assigned in accordance with the degree to which the input "fans out" or is common to the inputs of other sub-cones.

Following step 56, step 58 is executed, and an attempt is made to find the first test vector for the highest priority input which satisfies the rules for linear independence given above. If, following the execution of step 58, a test vector is found, then program execution branches to step 60, at which time, the test vector assignment is stored and the input priority is reduced by unity so that upon subsequent execution of step 58, the next highest priority will be considered. After step 60, step 62 is executed and a check is made to determine whether all of the inputs have been assigned a vector. If not, program execution branches back to step 58. Otherwise, program execution branches to step 64 and a check is made whether the each sub-cone $14_{ij}$ has been assigned an exhaustive vector. If so, then program execution ends (step 66).

Depending on which vectors have been previously assigned, a vector may not be available during step 58. If no vector is available for the particular input under consideration, then program execution branches to step 68. During execution of step 68, the vector assignments made previously are undone in the reverse order of the input priority until a valid assignment is found for the input under consideration. Once a valid assignment is found, program execution branches to step 58.

If no vector assignment is found possible during step 68, or if not all cones have been assigned exhaustive vectors during step 64, then step 70 is executed, and the size (number) of vectors is increased. For example, if the predetermined cone size (w) was established at twenty, so that the total number of vectors $\{a_1, a_2 \ldots a_w, b_1, b_2 \ldots b_w\}$ is forty, then, during step 70, the number of vectors is increased, typically by two. After step 70, program execution branches to step 58.

Circuit 10 Hardware Modifications

Implementation of the above-described testing technique to render the circuit 10 of FIG. 1 self-testing requires certain modifications to the circuit itself. For example, the circuit 10 must be modified to include a generator for generating canonical test vectors for application to the sub-cones $14_{1a}$–$14_{nx}$. Further, the circuit 10 must be modified so that the vectors can be presented to the inputs of all of the sub-cones $14_{1a}$–$14_{nx}$ and the response of the sub-cones to the vectors can be observed.

Test Generator 74

Figure 6:
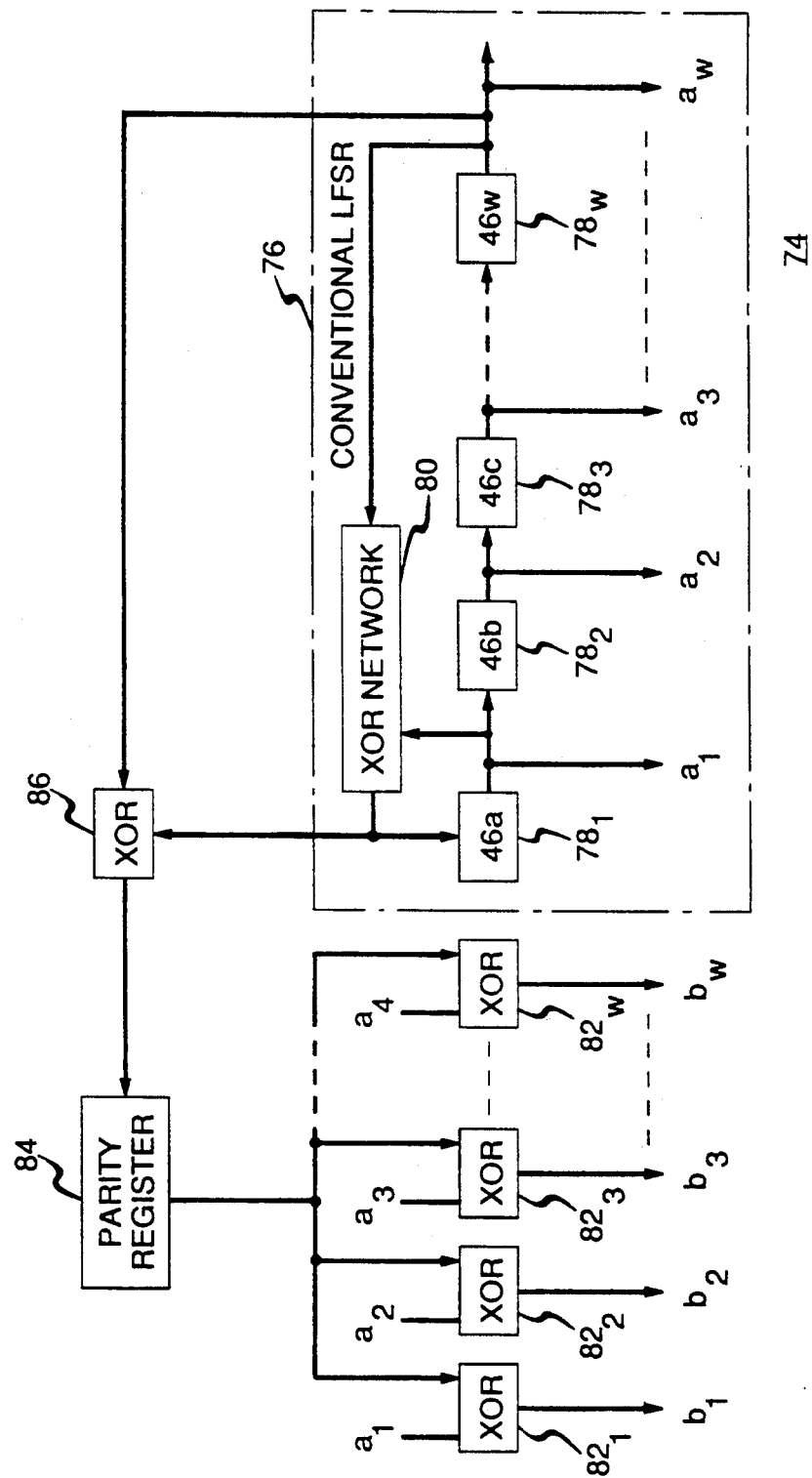
FIG. 6 is a block diagram of a test vector generator which may be added to the circuit of FIG. 1 to generate test vectors which are applied to test the circuit.

Referring to FIG. 6, there is shown a block schematic diagram of a vector generator 74 for inclusion within the circuit 10 of FIG. 1 for generating a set of canonical vectors $a_1, a_2, a_3 \ldots a_w$ and $b_1, b_2, b_3 \ldots b_n$. The generator 74 is comprised of a Linear Feedback Shift Register (LFSR) 76 which is comprised of w individual flip-flops $78_1, 78_2, 78_3 \ldots 78_w$, w being the size (number of inputs) of the largest of the sub-cones. The flip-flops $78_1, 78_2, 78_3 \ldots 78_w$ are daisy-chained together such that the output of the flip-flop $78_1$ feeds the flip-flop $78_2$ which, in turn, feeds the flip-flop $78_3$ and so on. The output of a subset of the flip-flops $78_1, 78_2, 78_3 \ldots 78_w$ (selected so as to establish a primitive polynomial) is fed, via an exclusive OR (XOR) network 80, back into the flip-flop $78_1$. The LSFR 76, configured as described, will generate the column vectors $a_1, a_2, a_3 \ldots a_w$, with each separate column vector being produced by a corresponding one of the flip-flops $78_1, 78_2, 78_3 \ldots 78_w$, respectively.

To generate the vectors $b_1, b_2, b_3 \ldots b_w$, the output of each of the flip-flops $78_1, 78_2, 78_3 \ldots 78_w$ is supplied to a first of a pair of inputs of a separate one of a set of two-input exclusive OR (XOR) gates $82_1, 82_2, 82_3 \ldots 82_w$, respectively. The second input of each of the XOR gates $82_1, 82_2, 82_3 \ldots 82_w$ is supplied with the output signal of a parity register 84 which is supplied at its input with the output signal of a two-input exclusive OR (XOR) gate 86. The XOR gate 86 is supplied at each of its inputs with the output signal of the XOR network 80 and the output of the flip-flop $78_w$, respectively. When the XOR gates $82_1, 82_2, 82_3 \ldots 82_w$ are each supplied with the output of a separate one of the flip-flops $78_1, 78_2, 78_3 \ldots 78_w$, respectively, and with the output of the parity register 84, each gate produces a separate one of the vectors $b_1, b_2, b_3 \ldots b_w$, respectively.

Test Point Multiplexer 21

Referring to FIG. 7, there is shown a schematic diagram of the test point multiplexer 21 mentioned previously with respect to FIG. 3. As may be seen in FIG. 7, the test point multiplexer 21 has a pair of inputs (1,0), the first (1) being supplied with the signal (i.e., a test vector) at an input (TEST VECTOR IN), the other input (0) supplied with an input signal (I), which represents the output signal of one of the sub-cones $14_{1a}$–$14_{nx}$. The test point multiplexer 21 is controlled by a control signal (TSEL) whose state determines whether the multiplexer passes the signal at its first or second input. Once the circuit 10 is partitioned into the sub-cones $14_{1a}$–$14_{nx}$ in the manner described with respect to FIG. 3, separate test point multiplexers 21 are each inserted into the circuit such that each has its second input (I) coupled to a corresponding test point (TP) (e.g., the node $20_6$ in FIG. 3) of a sub-cone which, in turn, feeds another sub-cone.

The purpose of inserting a test point multiplexer 21 at each node $20_i$ selected as a test point is to allow the node to be "controlled," that is, to allow a test vector to be injeceted into the node. As described earlier with respect to FIG. 3, the inputs to sub-cones $14_{a1}$–$14_{nx}$ obtained by partitioning the circuit 10 may not be controllable. The output of a sub-cone $14_{ij}$ (i.e., the signal appearing at a designated test point TP) may feed the input of at least one downstream sub-cone $14_{ij+1}$. By providing the test point multiplexer 21 at the designated test point TP, the output of the sub-cone can be isolated from the input of the downstream cone $14_{ij+1}$, allowing the latter to be tested exhaustively.

PEST Flip-Flop 88

As may be appreciated from FIG. 1, when the circuit 10 is modeled in the manner shown, the output of each cone $14_i$ serves as the input to a flip-flop $16_i$. Thus, when a cone $14_i$ is partitioned, there will be at least one resulting sub-cone $14_{ij}$ which will have its output supplied to the input of a flip-flop $16_i$. In order to observe the response of the sub-cone $14_{ij}$ which feeds a particular flip-flop $16_i$ as well as to enable self-testing of the flip-flops, each flip-flop $16_i$ within each register $12_i$ of FIG. 1 is replaced by a "Pseudo-Exhaustive Self-Test" (PEST) flip-flop system 88 of FIG. 8. As will be explained in greater detail below, the PEST flip-flop system 88 advantageously permits observance of the output of the sub-cone $14_{ij}$ during testing, and yet provides the normal function of the flip-flop 16 during conventional operation of the circuit 10 of FIG. 1. As will be described later, those of the sub-cones $14_{ij}$–$14_{ik}$ (where $k \geq x$) which do not have their outputs coupled to a PEST flip-flop system 88, may share a PEST flip-flop system.

Figure 8:
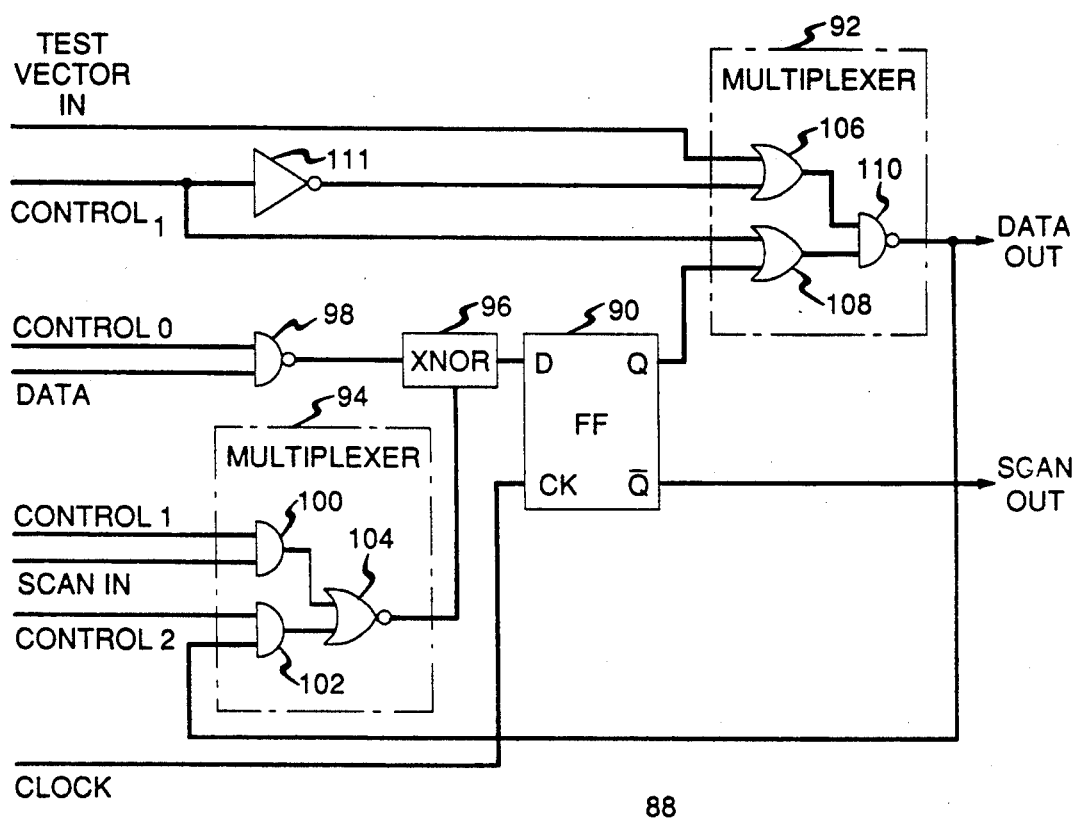
FIG. 8 is a block schematic diagram of a pseudo-exhaustive self-test (PEST) flip-flop circuit which, when substituted for a portion of the circuit of FIG. 1, serves to compact response data generated by the circuit upon receipt of a test vector and to multiplex the test vectors with the data normally input to the circuit.

Referring to FIG. 8, the PEST flip-flop system 88 is comprised of a conventional D-type flip-flop 90, a first multiplexer 92, a second multiplexer 94 and an exclusive NOR (XNOR) gate 96. The flip-flop 90 has a data (D) and clock (CK) inputs and a Q and $\overline{Q}$ output. The CK input of the flip-flop 90 is supplied with a clock signal for triggering purposes while the data (D) input of the flip-flop is supplied with the output of the XNOR gate 96. The Q output of the flip-flop 90 is supplied to the multiplexer 92 whereas the $\overline{Q}$ of the flip-flop (designated as the SCAN OUT output of the PEST flip-flop system 88) is coupled to the PEST flip-flop system (not shown) substituted within the register $12_i$ of FIG. 1 for an adjacent flip-flop $16_{i+1}$.

The XNOR gate 96 has two inputs, the first of which is coupled to the output of a two-input NAND gate 98 which is supplied with a pair of signals DATA and $CONTROL_0$. The signal DATA represents the input signal (from a cone $14_i$) which would otherwise be supplied to the flip-flop $16_i$ of FIG. 1 (now replaced by the PEST flip-flop system 88). The signal $CONTROL_0$ is one of a set of three control signals (the others being $CONTROL_1$ and $CONTROL_2$) generated by an external controller (not shown) which serves to control the operation of the PEST flip-flop system 88. The second input of the XNOR 96 gate is coupled to the output of the multiplexer 94 which is comprised of a pair of two-input AND gates 100 and 102, each having its output coupled to one of two inputs of a two-input NOR gate 104. The output of the NOR gate 104 serves as the output of the multiplexer 94.

The AND gate 100 is supplied at it first input with the control signal $CONTROL_1$ and is coupled at a second input (designated as SCAN IN) to the output SCAN OUT signal of another of the PEST flip-flop systems (not shown). As may now be appreciated, the SCAN IN and SCAN OUT outputs of the PEST flip-flop system 88 provide the means by which each of the PEST flip-flop systems within a register $12_i$ can be daisy-chained together. This allows the PEST flip-flop systems 88 to be self-tested using known scan techniques in a manner described later. The AND gate 102 of the multiplexer 94 is supplied at its first and second inputs with the control signal $CONTROL_2$ and with the output of the multiplexer 92, respectively.

With the multiplexer 94 configured as described, either the inverse of the signal received at the SCAN IN input from the upstream PEST flip-flop system 88 (not shown), or the inverse of the output signal from the multiplexer 92, will be passed to the second input of the XNOR gate 96, depending on the state of each of the signals $CONTROL_1$ and $CONTROL_2$. The XNOR gate 96 exclusive OR's the output signal of the multiplexer 94 and the output signal of the NAND gate 98. In this way, the XNOR gate 96 can act to compact signals at the DATA input with those at the SCAN IN input. The state of the output signal of the XNOR gate 96 causes the flip-flop 90 to set the signal at its Q and $\overline{Q}$ outputs accordingly.

The multiplexer 92 is comprised of a pair of two-input OR gates 106 and 108, each having its output coupled to the input of a two-input NAND gate 110 whose output serves as the output of the multiplexer, which is coupled to the input of one of the sub-cones $14_{1a}$–$14_{nx}$ downstream of the register $12_i$ containing the PEST flip-flop system 88. The OR gate 106 has its first input coupled to the input TEST VECTOR IN, which is supplied with a test vector generated by the generator 74 of FIG. 6. The second of the inputs of the OR gate 106 is coupled to the output of a NOT gate 111 which is supplied at its input with the control signal $CONTROL_1$ so that the OR gate receives a signal the equivalent of $\overline{CONTROL_1}$. The OR gate 108 has its first input supplied with the signal $CONTROL_1$ and has its second input supplied with the signal present at the Q output of the flip-flop 90. The multiplexer 92, configured as described, serves to pass either the inverse of the test vector received at the input TEST VECTOR IN or the inverse of the Q output of the flip-flop 90, to the output DATA OUT, depending on the state of the signal $CONTROL_1$.

The operation of the PEST flip-flop system 88 is controlled by the status of the control signals $CONTROL_0$, $CONTROL_1$ and $CONTROL_2$. Table III sets forth the logical relationship between the $CONTROL_0$, $CONTROL_1$ and $CONTROL_2$ and the different modes of operation of the PEST flip-flop system 88.

TABLE III

| CONTROL 0 | CONTROL$_1$ | CONTROL$_2$ | MODE OF OPERATION |
|---|---|---|---|
| 0 | 0 | 0 | Clear |
| 0 | 1 | 0 | Scan |
| 0 | 0 | 1 | Hold |
| 1 | 0 | 0 | Normal |
| 1 | 1 | 0 | TEST |

The "CLEAR" mode of operation is established when the signals $CONTROL_0$, $CONTROL_1$ and $CONTROL_2$ are each at a 0 logic level. This mode is entered into to set the PEST flip-flop system 88 to a logic 0 state. The CLEAR mode is entered at the beginning of testing to set the circuit 10 to a known state.

The "SCAN" mode of operation is established when the signals $CONTROL_0$, $CONTROL_1$ and $CONTROL_2$ are at a 0, 1 and 0 level, respectively, and enables the inverse of the signal at the SCAN IN input, received from the upstream PEST flip-flop system 88, to be scanned into the flip-flop 90 of FIG. 8. There is no net inversion in the data being scanned through the PEST flip-flop system 88, however, because the SCAN OUT output is sourced by the $\overline{Q}$ output of the flip-flop 90. The SCAN mode can be entered to access the final "signature" (residue) in the flip-flop 90 for comparison with the expected value at the completion of testing.

When $CONTROL_0$, $CONTROL_1$ and $CONTROL_2$ signals are each at a 0, 0 and 1 level, respectively, the "HOLD" mode is entered, causing the signal previously output at the Q output of the flip-flop 90 to be entered at its input. The HOLD mode of operation of the PEST flip-flop system 88 is entered into at the end of testing to retain the resulting signature (i.e., the residue in the flip-flop 90) until it can be accessed.

When the $CONTROL_0$, $CONTROL_1$ and $CONTROL_2$ signals are each at a 1, 0 and 0 levels, respectively, the PEST flip-flop system 88 operates in its "NORMAL" mode. During the NORMAL mode of operation, the inverse of the signals at the DATA IN input are latched into the flip-flop 90. There is no net inversion in the data passing through the PEST flip-flop system 88. This is because the Q output signal of the flip-flop 90 gets inverted as it passes through the multiplexer 92 before appearing on the PEST flip-flop system 88 DATA OUT output. The NORMAL mode of the PEST flip-flop system 88 performs the same functions as the flip-flop 16 of FIG. 1.

The "TEST" mode of operation is entered into when the control signals $CONTROL_0$, $CONTROL_1$ and $CONTROL_2$ are each at a 1, 1 and 0 level, respectively. During the TEST mode of operation, the inverse of the signal at the TEST VECTOR IN input, representing the separate one of the test vectors $\{a_1, a_2 \ldots a_w, b_1, b_2 \ldots b_w\}$, will be passed by the multiplexer 92 to the output DATA OUT for receipt at the input of the appropriate sub-cone $14_{ij}$ of FIG. 2. Each element of the signal (test vector) at the TEST VECTOR IN input passed by the multiplexer 92 is inverted; however, such inversion will not affect the exhaustiveness of the testing. At the same time, the signal at the SCAN IN input, representing the output signal of the upstream PEST flip-flop system (not shown), is compacted (logically combined) by the XNOR gate 96 with the signal at the DATA IN, which, during testing, represents the response signal of an upstream sub-cone $14_{ij}$. The compacted signal, represented by the output of the XNOR gate 96, will be held by the flip-flop 90 for further compaction or for output during the SCAN mode at the completion of testing. Since the PEST flip-flop systems 88 are daisy-chained together, the combination of such flip-flop systems effectively forms a Multiple Input Shift Register (MISR) which serves to compact the test data.

Test Point Compactor 22

As described above, the PEST flip-flop system 88 advantageously allows observance and compacting of the response of the corresponding one of the sub-cones $14_{la}$–$14_{nx}$ coupled to it. However, when the cones $14_l$–$14_n$ are partitioned, there is likely to be at least one of the sub-cones $14_{la\text{--}nx}$ which does not have its output directly coupled to a PEST flip-flop system 88. A separate PEST flip-flop system 88 could be provided for each sub-cone $14_{ij}$ at the expense of additional circuitry.

To avoid the need for additional PEST flip-flop systems 88, each subcone $14_{ij}$ not otherwise directly coupled to a PEST flip-flop system is provided with the test point compactor 22 described briefly above with respect to FIG. 3. The test point compactor 22 compacts the output of a sub-cone $14_{ij}$ (i.e., the signal appearing at a test point TP or a primary chip output) with the signal at the SCAN OUT of a PEST flip-flop system 88, to generate a signal for input to the SCAN IN input of a downstream PEST flip-flop system.

Figure 9:
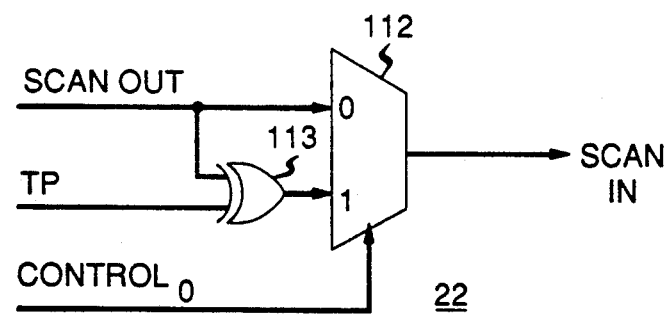
FIG. 9 is a block schematic diagram of a test point compactor for interfacing a portion of the circuit of FIG. 3 to the PEST flip-flop circuit of FIG. 7.

Referring to FIG. 9, there is shown a block diagram of the test point compactor 22, which is comprised of a two-input multiplexer 112 whose first input (0) is coupled to the SCAN OUT output of an upstream PEST flip-flop system 88 (not shown). The second input of the multiplexer 112 is coupled to the output of a two-input exclusive OR gate 113 having its first input supplied with the signal at the SCAN OUT output of the upstream PEST flip-flop system. The second input of the XOR gate 113 is supplied with the signal at the test point TP of the subcone/primary output (not shown) feeding the test point compactor 22.

The multiplexer 112 is controlled by the signal $CONTROL_0$. During the SCAN mode of operation of the PEST flip-flop system 88 of FIG. 8 (i.e., when the signal $CONTROL_0$ is at a logic 0 level), the multiplexer 112 of FIG. 9 passes the signal at the SCAN OUT output of the upstream PEST flip-flop system (received at the multiplexer's "0" input) to the downstream PEST flip-flop system. During the TEST mode of operation (when the signal $CONTROL_0$ is at a 1 level), the multiplexer 112 passes the output signal of the XOR gate 113 (which signal represents the compaction of the signal at the SCAN OUT output of the upstream PEST flip-flop system and the signal at the sub-cone output). In this way, the output of the sub-cone $14_{ij}$ is passed to the downstream PEST flip-flop system 88.

Operation Overview

As may now be appreciated, pseudo-exhaustive self-testing of the cones $14_1, 14_2 \ldots 14_n$ is accomplished in accordance with the invention by first partitioning the cones into individual sub-cones as described with respect to FIG. 3. The vector generator 74 for generating the set of vectors $\{a_1, a_2 \ldots a_w, b_1, b_2 \ldots b_w\}$ is added to the circuit 10. An exhaustive subset of the vectors is then assigned to each sub-cone $14_{ij}$ in the manner described in FIG. 5. Each vector in the subset is applied, through a separate one of the PEST flip-flop systems 88 and through the test points, to a separate one of the inputs of the sub-cone, which, in turn, produces a response vector whose state is indicative of whether the sub-cone is operating properly.

The response produced by each sub-cone is received by another PEST flip-flop system 88 downstream of the one which launched the test vector into the sub-cone. The PEST flip-flop system 88 receiving the response vector compacts it with the response vectors in this manner, a reduced stream of vectors is obtained, thereby simplifying the diagnosis of the logic cones $14_1, 14_2 \ldots 14_n$. The compacted stream of response vectors held by the PEST flip-flop systems 88 is then shifted out for subsequent analysis.

Each PEST flip-flop system 88 can be easily self-tested by toggling the state of the signals $CONTROL_0$, $CONTROL_1$ and $CONTROL_2$ so a successive one of eight separate combinations of signals is received by the flip-flop system. By toggling the state of the signals $CONTROL_0$, $CONTROL_1$ and $CONTROL_2$, any faults in the multiplexer 92, the multiplexer 94, the XNOR gate 96, or the flip-flop 90 will manifest themselves. Since the PEST flip-flop systems 88 are daisy-chained together, a fault which is present in any flip-flop will propagate itself through the chain, so that by monitoring the residue of the end flip-flop, a fault can be easily discovered.

The foregoing testing technique is described as being pseudo-exhaustive because the generated vectors assigned to each sub-cone achieve substantially exhaustive testing thereof. The testing technique is also described as being self-testing because the technique is typically carried out by the circuit 10 itself, after having been modified to include the vector generator 74 and a separate PEST flip-flop system 88 in place of each conventional flip-flop 16. No separate test equipment, other than a source for generating the signals $CONTROL_0$, $CONTROL_1$ and $CONTROL_2$, is required in order to carry out the present testing technique.

It is to be understood that the above-described embodiments are merely illustrative of the principles of the invention. Various modifications and changes may be made thereto by those skilled in the art which will embody the principles of the invention and fall within the spirit and scope thereof.

We claim:

1. A method of configuring a digital integrated circuit, comprised, in part, of a plurality of interconnected combinational elements, to render the circuit capable of being pseudo-exhaustively tested, comprising the steps of:

modeling the circuit such that the combinational elements are arranged in cones, each cone having a plurality of inputs and a single output;

partitioning the cones by designating the output of at least one combinational element therein as a test point in order to establish a plurality of subcones, each having no more than a user-selected number of inputs (w) and a single output represented by each test point, said partitioning being carried out by (a) successively examining the output of each combinational element in each cone to establish a list of primary inputs which feed the combinational element under examination and which primary outputs of the circuit are fed thereby;

(b) rating the examined combinational element on the basis of: (1) the number of cones (if any) which will have the number of their inputs reduced to no more than w if the examined node is designated as a test point and a sub-cone is established having such a test point as its output, and (2) the number of inputs reduced in those cones whose total number of inputs is not reduced to less than or equal to w;

(c) selecting the highest rated combinational element as a test point and thus creating a sub-cone which has the test point as its output;

(d) repeating the steps of (a), (b), and (c) until there remains no cone having more than w inputs; and establishing the assignment of inputs of the sub-cones for each of a set of test vectors which are to be applied thereto during pseudo-exhaustive testing such that when the test vectors of the set are applied to the inputs of each sub-cone, the test vectors are linearly independent, allowing the sub-cones to be exhaustively tested in parallel.

2. The method according to claim 1 wherein the assignment of inputs is established by the steps of:

(a) establishing a priority for the inputs to each of the sub-cones;

(b) determining if one of the vectors of the set of test vectors can be assigned to the highest priority sub-cone input while maintaining linear independence with all of the vectors (if any) assigned to other inputs of the same sub-cone;

(c) assigning the highest priority input to receive the vector so long as linear independence is maintained with the vectors to which the other inputs have been assigned; otherwise, reassigning the inputs to the vectors to maintain linear independence;

(d) reducing the priority after the then-highest input is assigned to a test vector; and (e) repeating the steps of (a)-(d) until all of the inputs have been assigned a vector.

3. In combination with a digital integrated circuit containing combinational elements which have been grouped into sub-cones, each sub-cone having a single output and no more than w inputs (where w is a user-selected number), the inputs receiving operating data under normal conditions, a system for pseudo-exhaustively testing the circuit comprising:

means for generating a set of test vectors, which, when applied to the sub-cones, exhaustively test them, causing each sub-cone to generate a response for each vector, said generating means including linear feedback shift register means for generating a first exhaustive set of vectors; a parity generator for generating a parity bit in accordance with the parity of the first and last bit generated by the shift register means; a plurality of exclusive OR gates, each serving to generate a separate one of a second set of vectors in accordance with the logical relationship between the parity bit and a separate one of the first set of exhaustive vectors; and means for supplying the circuit with operating data under normal operating conditions and for operating the circuit in a test mode to: (1) cease supplying the sub-cones with operating data and instead, provide them with test vectors such that each sub-cone can be tested exhaustively, and (2) compact the responses produced by the sub-cones upon receipt of the test vectors.

4. The apparatus according to claim 3 wherein the means for operating the circuit in the test mode includes a multiplexer for multiplexing the test vectors generated by the test vector-generating means with the normal operating data supplied to the circuit.

5. In combination with a circuit containing groups of combinational elements arranged in groups of sub-cones, each having one output and no more than (w) inputs, the improvement comprising:

means for generating a plurality of independent test vectors, which when applied to the inputs of the sub-cones, causes each cone to produce a response indicative of its faults (if any); and a plurality of daisy-chained flip-flop circuits, each serving to supply a test vector to the input of a sub-cone, and to compact the response produced by a sub-cone with a signal of an upstream flip-flop in the chain, the flip-flop circuits each including:

a flip-flop having a D input and Q and $\overline{Q}$ outputs;

a first multiplexer supplied with an input test vector for receipt at a sub-cone input and with the output signal present at the Q output of the flip-flop, the first multiplexer providing at its output a separate one of its input signals for receipt at the input of a sub-cone;

an exclusive NOR (XNOR) gate having a first input coupled to the output of a sub-cone, a second input coupled to an output of the previous flip-flop in the chain, and an output coupled to the D input of the flip-flop; and a second multiplexer having a first input supplied with the output signal of the first multiplexer, and supplied at a second input with the $\overline{Q}$ output signal of a flip-flop of an upstream flip-flop in the daisy chain, the second multiplexer providing at its output, a separate one of the signals at its input, for receipt at the second input of the XNOR gate.

* * * * *